(12) United States Patent
Kim et al.

(10) Patent No.: US 12,374,731 B2
(45) Date of Patent: Jul. 29, 2025

(54) BATTERY APPARATUS, BATTERY MANAGEMENT SYSTEM, AND METHOD FOR DIAGNOSING CONNECTION STATUS

(71) Applicant: LG Energy Solution, Ltd., Seoul (KR)

(72) Inventors: Minwoo Kim, Daejeon (KR); Bo Hyun Seo, Daejeon (KR); Seunghyun Lee, Daejeon (KR); Tae Youn Kim, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 559 days.

(21) Appl. No.: 17/790,337

(22) PCT Filed: Sep. 23, 2021

(86) PCT No.: PCT/KR2021/012928
§ 371 (c)(1),
(2) Date: Jun. 30, 2022

(87) PCT Pub. No.: WO2022/080692
PCT Pub. Date: Apr. 21, 2022

(65) Prior Publication Data
US 2023/0039404 A1   Feb. 9, 2023

(30) Foreign Application Priority Data

Oct. 12, 2020 (KR) .......................... 10-2020-0131092

(51) Int. Cl.
*H01M 10/48* (2006.01)
*B60L 50/64* (2019.01)
(Continued)

(52) U.S. Cl.
CPC ...... *H01M 10/482* (2013.01); *G01R 31/3648* (2013.01); *G01R 31/3842* (2019.01);
(Continued)

(58) Field of Classification Search
CPC ............ H01M 10/482; H01M 10/425; H01M 2010/4271; H01M 2220/20;
(Continued)

(56) References Cited

U.S. PATENT DOCUMENTS

| | | |
|---|---|---|
| 2012/0280692 A1 | 11/2012 | Park |
| 2014/0186665 A1 | 7/2014 | Takeyama |

(Continued)

FOREIGN PATENT DOCUMENTS

| | | |
|---|---|---|
| CN | 103430033 A | 12/2013 |
| CN | 108463934 A | 8/2018 |

(Continued)

OTHER PUBLICATIONS

Machine Translation of KR-20130068308-A (Mar. 17, 2025) (Year: 2025).*

(Continued)

*Primary Examiner* — Matthew J Merkling
(74) *Attorney, Agent, or Firm* — Lerner David LLP (57) ABSTRACT

In a battery apparatus, a battery pack includes a plurality of battery modules and a bus-bar connecting two battery modules among the plurality of battery modules. A wire connects the battery pack and the switch for controlling current supply of the battery pack. A voltage measuring circuit measures a voltage of the bus-bar, a voltage of the battery pack, and voltages of the plurality of battery modules. A processor diagnoses a connection status of the bus-bar and a connection status of the wire based on a current of the battery pack, the voltage of the bus-bar, the voltage of the battery pack, and the voltages of the plurality of battery modules.

13 Claims, 5 Drawing Sheets

(51) Int. Cl.
*B60L 58/10* (2019.01)
*G01R 31/36* (2020.01)
*G01R 31/3842* (2019.01)
*G01R 31/396* (2019.01)
*G01R 31/68* (2020.01)
*H01M 10/42* (2006.01)
*H01M 50/204* (2021.01)
*H01M 50/502* (2021.01)

(52) U.S. Cl.
CPC .......... *G01R 31/396* (2019.01); *G01R 31/68* (2020.01); *H01M 10/425* (2013.01); *H01M 50/204* (2021.01); *H01M 50/502* (2021.01); *B60L 50/64* (2019.02); *B60L 58/10* (2019.02); *H01M 2010/4271* (2013.01); *H01M 2220/20* (2013.01)

(58) Field of Classification Search
CPC .......... H01M 50/204; H01M 50/502; G01R 31/396; G01R 31/3842; G01R 31/68; G01R 31/3648; B60L 50/64; B60L 58/10
See application file for complete search history.

(56) References Cited

U.S. PATENT DOCUMENTS

| | | | |
|---|---|---|---|
| 2016/0306014 | A1* | 10/2016 | Jeon ................... G01R 31/3646 |
| 2018/0226690 | A1 | 8/2018 | Hwang |
| 2018/0248234 | A1 | 8/2018 | Okabe et al. |
| 2019/0217732 | A1* | 7/2019 | Zhou ................... B60L 50/60 |
| 2020/0355747 | A1 | 11/2020 | An |
| 2021/0188093 | A1* | 6/2021 | Gyani ................... B60L 50/64 |

FOREIGN PATENT DOCUMENTS

| | | | |
|---|---|---|---|
| CN | 111630398 | A | 9/2020 |
| JP | 2011054440 | A | 3/2011 |
| JP | 2012034535 | A | 2/2012 |
| JP | 2014235068 | A | 12/2014 |
| JP | 2015069964 | A | 4/2015 |
| JP | 2015117995 | A | 6/2015 |
| JP | 2016127696 | A | 7/2016 |
| JP | 2018021880 | A | 2/2018 |
| KR | 101189582 | B1 | 10/2012 |
| KR | 20130068308 | A * | 6/2013 |
| KR | 101310733 | B1 | 9/2013 |
| KR | 20140055065 | A | 5/2014 |
| KR | 20160068522 | A | 6/2016 |
| KR | 101655377 | B1 | 9/2016 |
| KR | 20180091350 | A | 8/2018 |
| KR | 2019-0086967 | A | 7/2019 |
| KR | 20200029305 | A | 3/2020 |

OTHER PUBLICATIONS

Extended European Search Report for Application No. 21880340.1 dated May 31, 2023. 7 pgs.

International Search Report for PCT/KR2021/012928 dated Jan. 7, 2022. 3 pgs.

Search Report dated Apr. 29, 2025 from the Office Action for Chinese Application No. 202180009296.1 Issued Apr. 30, 2025, pp. 1-3.

* cited by examiner

BATTERY APPARATUS, BATTERY MANAGEMENT SYSTEM, AND METHOD FOR DIAGNOSING CONNECTION STATUS

CROSS-REFERENCE TO RELATED APPLICATIONS

The present application is a national phase entry under 35 U.S.C. § 371 of International Application No. PCT/KR2021/012928 filed Sep. 23, 2021, which claims priority from Korean Patent Application No. filed 10-2020-0131092 filed Oct. 12, 2020, all of which are incorporated herein by reference.

TECHNICAL FIELD

The described technology relates to a battery apparatus, a battery management system, and a method for diagnosing a connection status.

BACKGROUND ART

An electric vehicle or a hybrid vehicle is a vehicle that obtains power by driving a motor mainly using a battery as a power supply. The electric vehicles are being actively researched because they are alternatives that can solve pollution and energy problems of internal combustion vehicles. Rechargeable batteries are used in various external apparatuses other than the electric vehicles.

Recently, as a battery having a high output and a large charging capacity is required, a battery pack in which a plurality of battery modules are connected in series is used. Two adjacent battery modules in the battery pack are connected to each other via a bus-bar. An output terminal of the battery pack is connected via a wire to a switch that controls supply of a current to the battery pack.

Accordingly, when a problem occurs in the connection of the bus-bar or a problem occurs in the wire for connecting the battery pack and an external apparatus, power cannot be supplied through the battery pack.

SUMMARY

Technical Problem

Some embodiments may provide a battery apparatus, a battery management system, and a method for diagnosing a connection status, for diagnosing a problem related to a connection status of the battery apparatus.

Technical Solution

According to an embodiment, a battery apparatus including a battery pack, a first switch, a first wire, a voltage measuring circuit, and a processor may be provided. The battery pack may include a plurality of battery modules and a bus-bar connecting first and second battery modules of the plurality of battery modules to one another. The first switch may control current supply of the battery pack, and the first wire may connect the battery pack and the first switch. The voltage measuring circuit may measure a voltage of the bus-bar, a voltage of the battery pack, and voltages of the plurality of battery modules. The processor may diagnose a connection status of the bus-bar and a connection status of the first wire based on a current of the battery pack, the voltage of the bus-bar, the voltage of the battery pack, and the voltages of the plurality of battery modules.

In some embodiments, the processor may calculate a resistance of the bus-bar based on the voltage of the bus-bar and the current of the battery pack, and diagnose the connection status of the bus-bar based on the resistance of the bus-bar.

In some embodiments, in response to the resistance of the bus-bar being greater than a threshold, the processor may diagnose that an error has occurred in the connection status of the bus-bar.

In some embodiments, the processor may determine the voltage of the bus-bar based on a voltage between a first node at which the bus-bar is connected to the first battery module and a second node at which the bus-bar is connected to the second battery module.

In some embodiments, the processor may determine a voltage across the first wire based on the voltage of the bus-bar, the voltage of the battery pack, and the voltages of the plurality of battery modules, calculate a resistance of the first wire based on the voltage across the first wire and the current of the battery pack, and diagnose the connection status of the first wire based on the resistance of the first wire.

In some embodiments, in response to the resistance of the first wire being greater than a threshold, the processor may diagnose that an error has occurred in the connection status of the first wire.

In some embodiments, the apparatus may include a second switch and a second wire, the first wire connecting a positive terminal of the battery pack to the first switch, the second wire connecting a negative terminal of the battery pack to the second switch. In this case, the processor may be configured to determine a voltage across the first and second wires based on the voltage of the bus-bar, the voltage of the battery pack, and the voltages of the plurality of battery modules, calculate a resistance of the first and second wires based on the voltage across the first and second wires and the current of the battery pack, and diagnose the connection status of the first and second wires based on the resistance of the first and second wires.

In some embodiments, the voltage measuring circuit may measure the voltage of the battery pack based on a voltage between a first node at which the first wire is connected to the first switch and a second node to which the second wire is connected to the second switch.

In some embodiments, the processor may determine the voltage across the first wire based on a value obtained by subtracting a sum of the voltages of the plurality of battery modules and the voltage of the bus-bar from the voltage of the battery pack.

In some embodiments, the apparatus may further include a plurality of bus-bars, and each of the bus-bars may connect a different pair of battery modules of the plurality of battery modules to one another. In this case, the processor may determine the voltage across the first wire based on a value obtained by subtracting a sum of the voltages of the plurality of battery modules and a sum of voltages of the plurality of bus-bars from the voltage of the battery pack.

According to another embodiment, a method of diagnosing a connection status of a battery pack including a plurality of battery modules may be provided. The method may include measuring a current of the battery pack, measuring a voltage of the battery pack, measuring a voltage of each of the plurality of battery modules, measuring a voltage of a bus-bar connecting first and second battery modules of the plurality of battery modules to one another, and diagnosing a connection status of the bus-bar and a connection status of a wire connected to the battery pack, based on the current of the battery pack, the voltage of the bus-bar, the voltage of the battery pack, and voltages of the plurality of battery modules.

In some embodiments, the method may further include calculating a resistance of the bus-bar based on the voltage of the bus-bar and the current of the battery pack, and diagnosing the connection status of the bus-bar may be based on the resistance of the bus-bar.

In some embodiments, the method may further include determining a voltage across the first wire based on the voltage of the bus-bar, the voltage of the battery pack, and the voltages of the plurality of battery modules, and calculating a resistance of the first wire based on the voltage across the first wire and the current of the battery pack, and diagnosing the connection status of the first wire may be based on the resistance of the first wire.

In some embodiments, the first wire may connect a positive terminal of the battery pack to a first switch for controlling current supply of the battery pack, and a second wire may connect a negative terminal of the battery pack to a second switch for controlling current supply of the battery pack. In this case, the measuring the voltage of the battery pack may be based on a voltage between a first node at which the first wire is connected to the first switch and a second node at which the second wire is connected to the second switch.

According to yet another embodiment, a battery management system may include a voltage measuring circuit configured to measure a voltage of a bus-bar connecting two battery modules of a battery pack to one another, a voltage of the battery pack, and voltages of a plurality of battery modules included in the battery pack, the plurality of battery modules including the two battery modules, and a processor configured to diagnose a connection status of the bus-bar and a connection status of a wire connecting the battery pack to a switch for controlling current supply of the battery pack, wherein the processor is configured to diagnose the connection status of the bus-bar and the connection status of the wire based on a current of the battery pack, the voltage of the bus-bar, the voltage of the battery pack, and the voltages of the plurality of battery modules.

Advantageous Effects

According to some embodiments, a connection state of a bus-bar and a wire may be diagnosed in the battery apparatus.

DETAILED DESCRIPTION

In the following detailed description, only certain embodiments have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

When it is described that an element is "connected" to another element, it should be understood that the element may be directly connected to the other element or connected to the other element through a third element. On the other hand, when it is described that an element is "directly connected" to another element, it should be understood that the element is connected to the other element through no third element.

As used herein, a singular form may be intended to include a plural form as well, unless the explicit expression such as "one" or "single" is used.

In flowcharts described with reference to the drawings, the order of operations or steps may be changed, several operations or steps may be merged, a certain operation or step may be divided, and a specific operation or step may not be performed.

Figure 1:
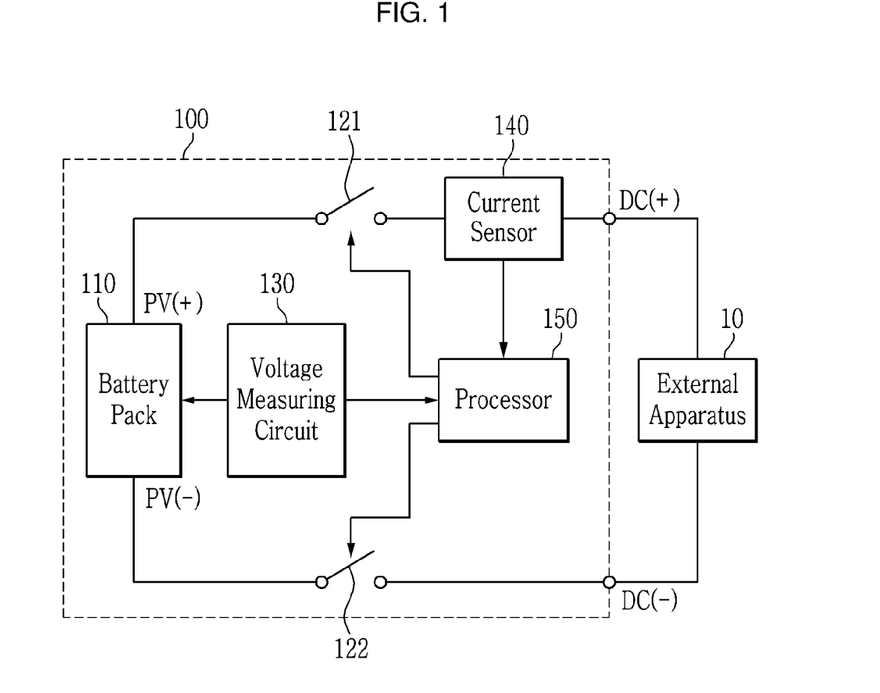
FIG. 1 is a diagram showing a battery apparatus according to an embodiment.

FIG. 1 is a diagram showing a battery apparatus according to an embodiment.

Referring to FIG. 1, a battery apparatus 100 has a structure that can be electrically connected to an external apparatus through a positive link terminal DC(+) and a negative link terminal DC(−). In some embodiments, the battery apparatus 100 may be connected to the external apparatus 10 through the positive link terminal DC(+) and the negative link terminal DC(−). When the external apparatus is a load, the battery apparatus 100 is discharged by operating as a power supply that supplies power to the load. The external apparatus operating as the load may be, for example, an electronic device, a mobility apparatus, or an energy storage system (ESS). The mobility apparatus may be, for example, a vehicle such as an electric vehicle, a hybrid vehicle, or a smart mobility.

The battery apparatus 100 includes a battery pack 110, a positive main switch 121, a negative main switch 122, a voltage measuring circuit 130, a current sensor 140, and a processor 150.

The battery pack 110 has a positive terminal PV(+) and a negative terminal PV(−). The battery pack includes a plurality of battery modules (not shown) connected in series between the positive terminal PV(+) and the negative terminal PV(−), and each battery module includes a plurality of battery cells (not shown) connected in series. In some embodiments, the battery cell may be a rechargeable cell. In this way, the plurality of battery modules may be connected in the battery pack 110 to supply desired power.

The positive main switch 121 is connected between the positive terminal PV(+) of the battery pack 110 and the positive link terminal DC(+) of the battery apparatus 100. The negative main switch 122 is connected between the negative terminal PV(−) of the battery pack 110 and the negative link terminal DC(−) of the battery apparatus 100. The switches 121 and 122 may be controlled by the processor 150 to control an electrical connection between the battery pack 110 and the external apparatus. That is, the switches 121 and 122 may control supply of a current of the battery pack 110. In one embodiment, each of the switches 121 and 122 may be a contactor implemented in a relay. In another embodiment, each of the switches 121 and 122 may be an electrical switch such as a transistor. In some embodiments, the battery apparatus 100 may further include driving circuits (not shown) for controlling the switches 121 and 122, respectively.

The voltage measuring circuit 130 measures a voltage at a predetermined point in the battery apparatus 100. The current sensor 140 measures the current of the battery pack 110. In some embodiments, the current sensor 140 may measure a discharge current of the battery pack 110 (e.g., a current flowing from the positive terminal PV(+) of the battery pack 110 to the positive link terminal DC(+)) or a charging current of the battery pack 110 (e.g., a current flowing from the positive link terminal DC(+) to the positive terminal PV(+) of the battery pack 110). Although the current sensor 140 is shown as being connected between the positive terminal PV(+) and the positive link terminal DC(+) of the battery pack in FIG. 1, a position of the current sensor 140 is not limited thereto. For example, the current sensor 140 may be connected between the negative terminal PV(−) of the battery pack and the negative link terminal DC(−). In some embodiments, the current sensor 140 may be included in the battery pack 110.

The processor 150 diagnoses a connection status of the battery apparatus 100 based on the voltage measured by the voltage measuring circuit 130 and the current measured by the current sensor 140. In some embodiments, the processor 150 may control operations of the switches 121 and 122. The processor 150 may be, for example, a micro controller unit (MCU).

The processor 150 may form a battery management system. In some embodiments, the battery management system may further include the voltage measuring circuit 130 or the current sensor 140.

Figure 2:
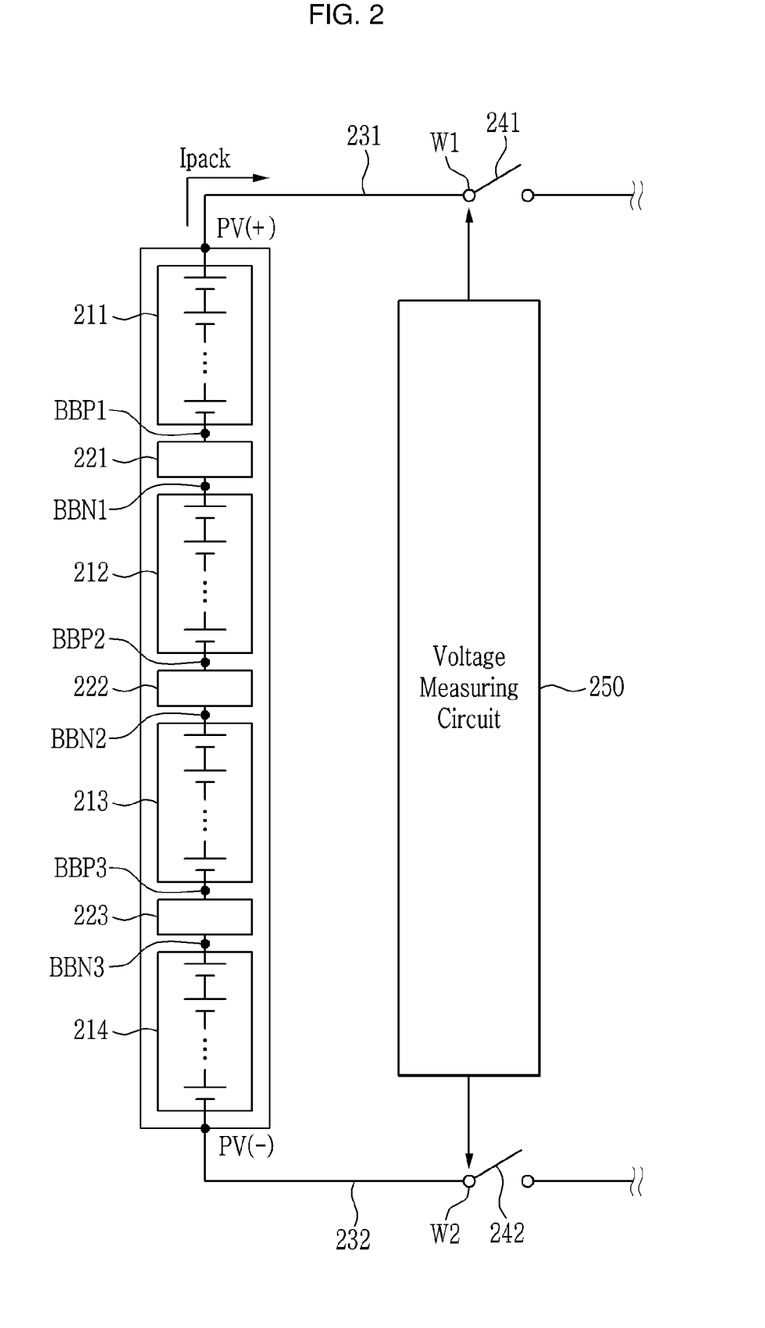
FIG. 2 is a diagram for explaining voltage measurement of a battery apparatus according to an embodiment.
Figure 3:
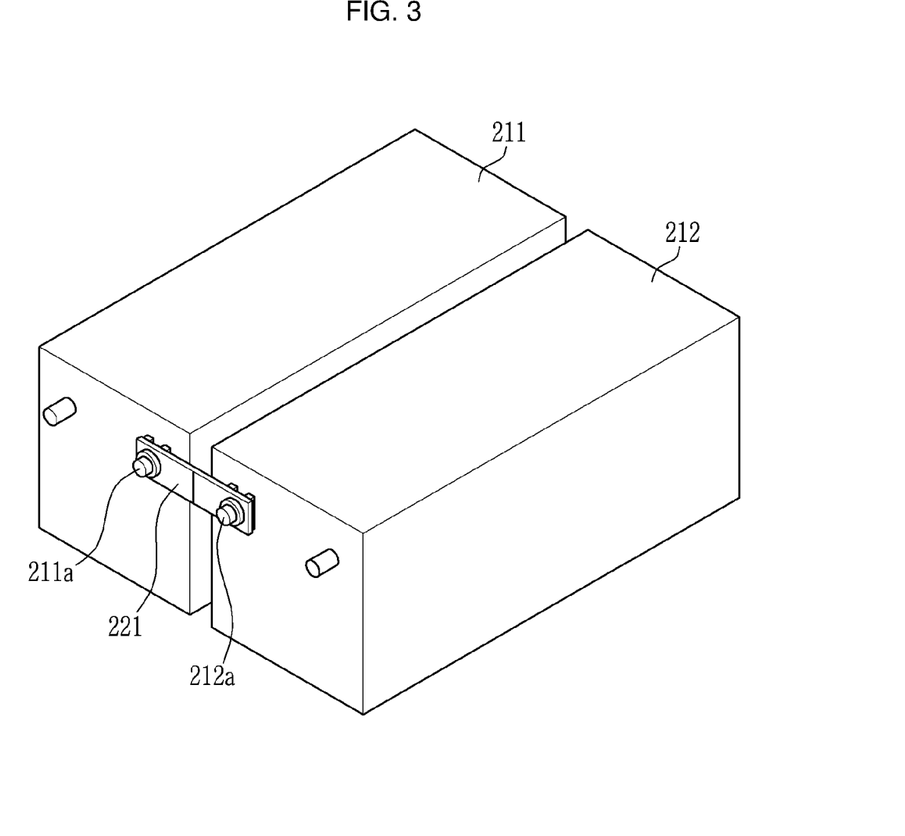
FIG. 3 is a diagram showing an example of a bus-bar in a battery apparatus according to an embodiment.

FIG. 2 is a diagram for explaining voltage measurement of a battery apparatus according to an embodiment, and FIG. 3 is a diagram showing an example of a bus-bar in a battery apparatus according to an embodiment.

Referring to FIG. 2, a plurality of battery modules 211, 212, 213, and 214 are connected in series in a battery pack 210. Although four battery modules 211, 212, 213, and 214 are shown in FIG. 2 for convenience of description, the number of battery modules is not limited thereto.

Two adjacent battery modules are connected via a bus-bar. A bus-bar 221 connects the battery module 211 and the battery module 212, a bus-bar 222 connects the battery module 212 and the battery module 213, and a bus-bar 223 connects the battery module 213 and the battery module 214. A first terminal of the bus-bar 221 may be connected to a node BBP1 corresponding to a negative terminal of the battery module 211, and a second terminal of the bus-bar 221 may be connected to a node BBN1 corresponding to a positive terminal of the battery module 212. Further, a first terminal of the bus-bar 222 may be connected to a node BBP2 corresponding to a negative terminal of the battery module 212, and a second terminal of the bus-bar 222 may be connected to a node BBN2 corresponding to a positive terminal of the battery module 213. Furthermore, a first terminal of the bus-bar 223 may be connected to a node BBP3 corresponding to a negative terminal of the battery module 213, and a second terminal of the bus-bar 223 may be connected to a node BBN3 corresponding to a positive terminal of the battery module 214. In some embodiments, the positive terminal of each battery module may be connected to a positive electrode of the first battery cell among a plurality of battery cells, which are included in the corresponding battery module and are connected in series, and the negative terminal of each battery module may be connected to a negative electrode of the last battery cell among the plurality of battery cells, which are included in the corresponding battery module and are connected in series.

In some embodiments, the bus-bars 221, 222, and 223 may be formed of a material having electrical conductivity. The bus-bars 221, 222, and 223 may be formed in various shapes according to a structure of the battery pack 210 or the battery modules 211, 212, 213 and 214. For example, as shown in FIG. 3, the bus-bar 221 may be connected with an electrode terminal 211a of one battery module 211 and an electrode terminal 212a of the other battery module 212 so as to connect the battery module 211 and the battery module 212. The electrode terminal 211a of the battery module 211 may be a negative terminal of the battery module 211, and the electrode terminal 212a of the battery module 212 may be a positive terminal of the battery module 212. As described above, since the bus-bar 221 is used for connecting the two battery modules, a current supplied from the battery apparatus may be interrupted when the connection is broken due to a defect in the connection status of the bus-bar.

The positive terminal PV(+) of the battery pack 210 is connected to a positive main switch 241 through a wire 231, and the negative terminal PV(−) of the battery pack 210 is connected to a negative main switch 242 through a wire 232. In this case, the wire 231 may be connected to the positive main switch 241 at a node W1, and the wire 232 may be connected to the negative main switch 242 at a node W2. In some embodiments, the positive terminal PV(+) of the battery pack 210 may correspond to a positive terminal of the first battery module 211 among the plurality of battery modules 211, 212, 213, and 214 included in the battery pack 210, and the negative terminal PV(−) of the battery pack 210 may correspond to a negative terminal of the last battery module 214 among the plurality of battery modules 211, 212, 213 and 214 included in the battery pack 210. In some embodiments, the wires 231 and 232 may be provided as a wire harness.

When the positive main switch 241 and the negative main switch 242 are closed, a current $I_{pack}$ flows through the battery pack 210. That is, the current $I_{pack}$ flows through the plurality of battery modules 211, 212, 213, and 214. In this case, a voltage measuring circuit 250 measures voltages of the bus-bars 221, 222, and 223. The voltage measuring circuit 250 may measure a voltage between the first terminal and the second terminal of each bus-bar as the voltage of the corresponding bus-bar. That is, the voltage measuring circuit 250 may measure a voltage between the both terminals of the bus-bar 221, i.e., a voltage between the two nodes BBP1 and BBN1, as a voltage of the bus-bar 221, measure a voltage between the both terminals of the bus-bar 222, i.e., a voltage between the two nodes BBP2 and BBN2, as a voltage of the bus-bar 222, and measure a voltage between the both terminals of the bus-bar 223, i.e., a voltage between the two nodes BBP3 and BBN3, as a voltage of the bus-bar 223.

In some embodiments, the voltage measuring circuit 250 may include a cell voltage monitoring integrated circuit (IC). In some embodiments, a plurality of cell voltage monitoring ICs respectively corresponding to a plurality of battery modules may be provided. In some embodiments, one cell voltage monitoring IC may correspond to at least two battery modules among the plurality of battery modules. In some embodiments, one of the plurality of battery modules may correspond to two cell voltage monitoring ICs. In this case, one of the cell voltage monitoring ICs may correspond to some battery cells of the corresponding battery module, and the other one of the cell voltage monitoring ICs may correspond to the remaining battery cells of the corresponding battery module.

In some embodiments, the cell voltage monitoring IC may include a plurality of pins respectively connected to a plurality of battery cells of the battery module and two pins respectively connected to both terminals of the bus-bar. In this case, the cell voltage monitoring IC may measure the voltage of the bus-bar through the two pins respectively connected to both terminals of the bus-bar. Further, the cell voltage monitoring IC may measure a voltage of the battery cell through pins connected to the positive and negative electrodes of the battery cell.

The processor (e.g., 150 in FIG. 1) may diagnose connection statuses of the bus-bars 221, 222, and 223 based on the voltages measured by the voltage measuring circuit 250.

Next, a method of diagnosing a connection status in a battery apparatus according to various embodiments is described with reference to FIG. 4 and FIG. 5.

Figure 4:
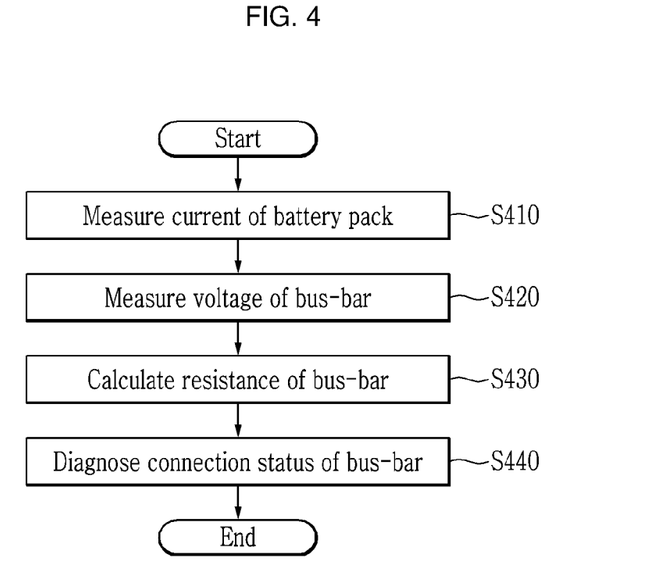
FIG. 4 is a flowchart showing a method for diagnosing a connection status in a battery apparatus according to an embodiment.

FIG. 4 is a flowchart showing a method for diagnosing a connection status in a battery apparatus according to an embodiment.

Referring to FIG. 4, a processor (e.g., 150 in FIG. 1) of a battery management system closes a positive main switch (e.g., 141 in FIG. 2) and a negative main switch (e.g., FIG. 142 in FIG. 2). Then, a current flows through the battery pack (e.g., 210 in FIG. 2). Accordingly, the processor 150 receives a current of the battery pack measured by a current sensor at S410.

Further, a voltage measuring circuit 250 measures a voltage of a bus-bar (e.g., 221, 222, or 223 in FIG. 2) connecting adjacent battery modules at S420. In some embodiments, the voltage measuring circuit 250 may measure a voltage between both terminals of the bus-bar 221, 222, or 223 as the voltage of the bus-bar 221, 222, or 223. The processor 150 receives the voltages of the bus-bars 221, 222, and 223 from the voltage measuring circuit 250 at S420.

Next, the processor 150 calculates a resistance of each of the bus-bars 221, 222, and 223 based on the current of the battery pack 210 and the voltage of each of the bus-bars 221, 222, and 223 at S430. In some embodiments, as shown in FIG. 2, since the current of the battery pack 210 flows through the bus-bars 221, 222, and 223, the voltage measuring circuit 250 may determine, as the resistance of each of the bus-bars 221, 222, and 223, a value obtained by dividing the voltage of each of the bus-bars 221, 222, and 223 by the current of the battery pack 210, as in Equation 1.

$$R_{busbar} = \frac{V_{busbar}}{I_{pack}}$$

Equation 1

In Equation 1, $R_{busbar}$ denotes the resistance of the busbar, $V_{busbar}$ denotes the voltage of the busbar, and $I_{pack}$ denotes the current of the battery pack.

The processor 150 diagnoses a connection status of the battery apparatus based on the resistance of each bus-bar and a resistance of a wire at S440. In some embodiments, the processor 150 may determine whether the resistance of each bus-bar is greater than a threshold, and if there is a bus-bar having the resistance greater than the threshold, the processor 150 may diagnose that an error has occurred in the connection status of the corresponding bus-bar. In some embodiments, when diagnosing that the error has occurred in the connection status of the bus-bar, the processor 150 may transmit an error signal to an external apparatus (e.g., a vehicle). Accordingly, a user (e.g., a driver) of the external apparatus may check the error and perform an action corresponding to the error.

On the other hand, as shown in FIG. 2, in the battery pack 210, an error may occur not only in the connection of the bus-bar, but also in a connection status of wires 231 and 232 connecting the battery pack 210 and the main switches 241 and 242. Accordingly, it may not be possible to accurately diagnose the connection status of the battery apparatus only by diagnosing the connection status of the bus-bar.

Figure 5:
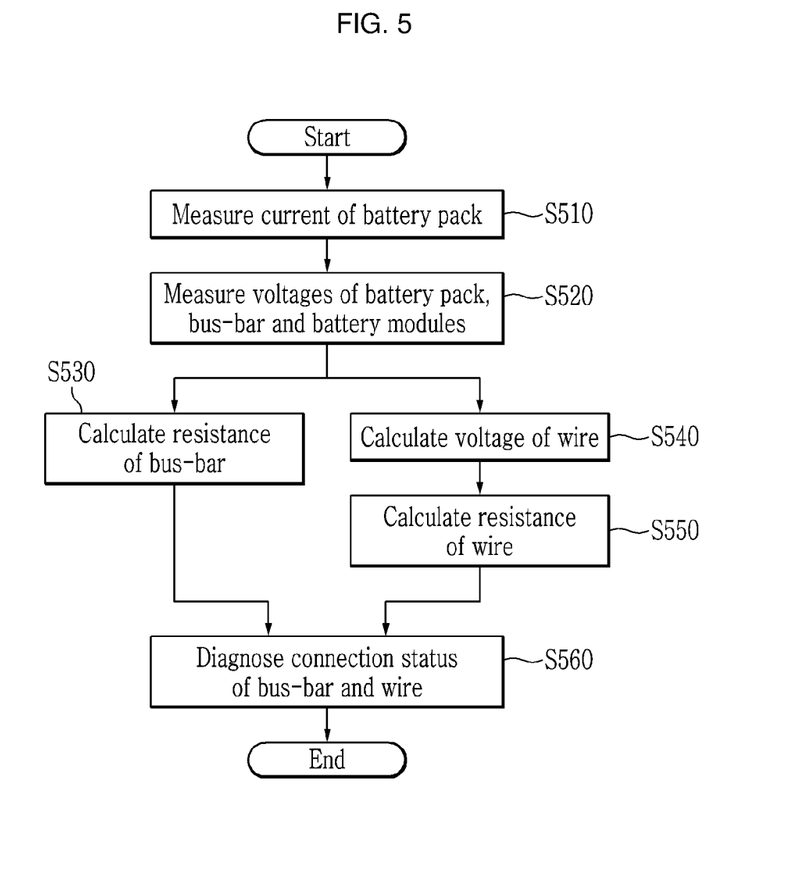
FIG. 5 is a flowchart showing a method for diagnosing a connection status in a battery apparatus according to another embodiment.

FIG. 5 is a flowchart showing a method for diagnosing a connection status in a battery apparatus according to another embodiment.

Referring to FIG. 5, a processor (e.g., 150 in FIG. 1) of the battery management system closes a positive main switch (e.g., 141 in FIG. 2) and a negative switch (e.g., FIG. 142 in FIG. 2). Then, a current flows through a battery pack (e.g., 210 in FIG. 2). Accordingly, the processor 150 receives a current of the battery pack measured by a current sensor at S510.

Further, a voltage measuring circuit (e.g., 250 in FIG. 2) measures a voltage of a bus-bar (e.g., 221, 222, or 223 in FIG. 2) connecting adjacent battery modules. In some embodiments, the voltage measuring circuit 250 may measure a voltage between both terminals of the bus-bar 221, 222, or 223 as the voltage of the bus-bar 221, 222, or 223. The processor 150 receives the voltages of the bus-bars 221, 222, and 223 from the voltage measuring circuit 250 at S520.

Furthermore, the voltage measuring circuit 250 measures a voltage of the battery pack 210 and voltages of battery modules (e.g., 211, 212, 213, and 214 in FIG. 2) at S520. In some embodiments, the voltage measuring circuit 250 may measure the voltage of the battery pack 210 by measuring voltages of nodes at which wires (e.g., 231 and 232 in FIG. 2) of the battery pack 210 are connected to the main switches (e.g., 241 and 242 in FIG. 2). In some embodiments, the voltage measuring circuit 250 may measure a voltage between a positive terminal and a negative terminal of each battery module as the voltage of the corresponding battery module. In some embodiments, the voltage measuring circuit 250 may measure the voltage of each battery module as a sum of voltages of a plurality of battery cells included in the corresponding battery module. The processor 150 receives the voltage of the battery pack 210 and the voltages of the battery modules from the voltage measuring circuit 250 at S520.

The processor 150 calculates a resistance of each of the bus-bars 221, 222, and 223 based on the current of the battery pack 210 and the voltage of each of the bus-bars 221, 222, and 223 at S530. In some embodiments, the processor 150 may calculate the resistance of each of the bus-bars 221, 222, and 223 as described with reference to S430 of FIG. 4.

Further, the processor 150 calculates a voltage across the wires 231 and 232 based on the current of the battery pack 210, the voltage of the battery pack 210, and the voltages of the battery modules 211, 212, 213 and 214 at S540. In some embodiments, the voltage measuring circuit 250 may measure the voltage of the battery pack 210 by measuring a voltage of a node (e.g., W1 in FIG. 2) at which the wire 231 is connected to the positive main switch 241 and a voltage of a node (e.g., W2 in FIG. 2) at which the wire 232 is connected to the negative main switch 242. That is, the voltage measuring circuit 250 may measure a voltage between the two nodes W1 and W2 as the voltage of the battery pack 210. In some embodiments, as shown in FIG. 2, the voltage of the battery pack 210, i.e., the voltage between the two nodes W1 and W2 is formed by the voltage across the wires 231 and 232, the voltages of the battery module 211, 212, 213, and 214, and the voltages of the bus-bars 221, 222, and 223, the processor 150 may determine, as the voltage across the two wires 231 and 232, a value obtained by subtracting the voltages of the battery modules 211, 212, 213, and 214, and the voltages of the bus-bars 221, 222, and 223 from the voltage of the battery pack 210, as in Equation 2.

$$V_{wire} = V_{pack} - \sum_{i=1}^{N} V_{module}(i) - \sum_{i=1}^{M} V_{busbar}(i) \qquad \text{Equation 2}$$

In Equation 2, $V_{wire}$ denotes the voltage across the two wires, $V_{pack}$ denotes the voltage of the battery pack, $V_{module}$ (i) denotes the voltage of the i-th battery module, N denotes the number of battery modules included in the battery pack, $V_{busbar}$ (i) denotes the voltage of the i-th bus-bar, and M denotes the number of bus-bars included in the battery pack. In some embodiments, M may be equal to (N−1).

Furthermore, the processor 150 calculates a resistance of the wires 231 and 232 based on the current of the battery pack 210 and the voltage across the wires 231 and 232 at S550. In some embodiments, since the current of the battery pack 210 flows through the wires 231 and 232 as shown in FIG. 2, the voltage measuring circuit 250 may determine, as the resistance of the two wires 231 and 232, a value obtained by dividing the voltage across the wires 231 and 232 by the current of the battery pack 210.

$$R_{wire} = \frac{V_{wire}}{I_{pack}} \qquad \text{Equation 3}$$

In Equation 3, $R_{wire}$ denotes the resistance of the two wires, $V_{wire}$ denotes the voltage across the two wires, and $I_{pack}$ denotes the current of the battery pack.

The processor 150 diagnoses a connection status of the battery apparatus based on the resistance of each bus-bar and the resistance of the wires at S560. In some embodiments, the processor 150 may determine whether the resistance of each bus-bar is greater than a threshold, and if there is a bus-bar having the resistance greater than the threshold, the processor 150 may diagnose that an error has occurred in the connection status of the corresponding bus-bar. Further, the processor 150 may determine whether the resistance of the wires is greater than a threshold, and if the resistance of the wires is greater than the threshold value, the processor 150 may diagnose that an error has occurred in the connection status of the wires. In some embodiments, when diagnosing that the error has occurred in the connection status of the bus-bar or wires, the processor 150 may transmit an error signal to an external apparatus (e.g., a vehicle). Accordingly, a user (e.g., a driver) of the external apparatus may check the error and perform an action corresponding to the error.

According to the above-described embodiments, not only the connection status of the bus-bar but also the connection status of the wires connecting the battery pack to the main switches can be diagnosed, so that the connection status of the battery apparatus can be accurately diagnosed.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

The invention claimed is:

1. A battery apparatus comprising:
    a battery pack including a plurality of battery modules and a bus-bar connecting first and second battery modules of the plurality of battery modules to one another;
    a first switch configured to control current supply of the battery pack;
    a first wire connecting the battery pack and the first switch;
    a voltage measuring circuit configured to measure a voltage of the bus-bar, a voltage of the battery pack, and voltages of the plurality of battery modules; and
    a processor configured to:
        diagnose a connection status of the bus-bar;
        determine a voltage across the first wire based on the voltage of the bus-bar, the voltage of the battery pack, and the voltages of the plurality of battery modules;
        calculate a resistance of the first wire based on the voltage across the first wire and a current of the battery pack; and
        diagnose a connection status of the first wire based on the resistance of the first wire.

2. The battery apparatus of claim 1, wherein the processor is configured to:
    calculate a resistance of the bus-bar based on the voltage of the bus-bar and the current of the battery pack; and
    diagnose the connection status of the bus-bar based on the resistance of the bus-bar.

3. The battery apparatus of claim 2, wherein the processor is configured to diagnose that an error has occurred in the connection status of the bus-bar, in response to the resistance of the bus-bar being greater than a threshold.

4. The battery apparatus of claim 1, wherein the processor is configured to determine the voltage of the bus-bar based on a voltage between a first node at which the bus-bar is connected to the first battery module and a second node at which the bus-bar is connected to the second battery module.

5. The battery apparatus of claim 1, wherein the processor is configured to diagnose that an error has occurred in the connection status of the first wire, in response to the resistance of the first wire being greater than a threshold.

6. A battery apparatus comprising:
    a battery pack including a plurality of battery modules and a bus-bar connecting first and second battery modules of the plurality of battery modules to one another;
    a first switch configured to control current supply of the battery pack;
    a first wire connecting the battery pack and the first switch;
    a voltage measuring circuit configured to measure a voltage of the bus-bar, a voltage of the battery pack, and voltages of the plurality of battery modules; and
    a processor configured to diagnose a connection status of the bus-bar and a connection status of the first wire based on a current of the battery pack, the voltage of the bus-bar, the voltage of the battery pack, and the voltages of the plurality of battery modules, the battery apparatus further comprising a second switch and a second wire,
    wherein the first wire connects a positive terminal of the battery pack to the first switch, and the second wire connects a negative terminal of the battery pack to the second switch, and wherein the processor is configured to:
  determine a voltage across the first and second wires based on the voltage of the bus-bar, the voltage of the battery pack, and the voltages of the plurality of battery modules;
  calculate a resistance of the first and second wires based on the voltage across the first and second wires and the current of the battery pack; and
  diagnose the connection status of the first and second wires based on the resistance of the first and second wires.

7. The battery apparatus of claim 6, wherein the voltage measuring circuit is configured to measure the voltage of the battery pack based on a voltage between a first node at which the first wire is connected to the first switch and a second node at which the second wire is connected to the second switch.

8. The battery apparatus of claim 1, wherein the processor is configured to determine the voltage across the first wire based on a value obtained by subtracting a sum of the voltages of the plurality of battery modules and the voltage of the bus-bar from the voltage of the battery pack.

9. The battery apparatus of claim 1, further comprising a plurality of bus-bars, each of the bus-bars connecting a different pair of battery modules of the plurality of battery modules to one another, and
  wherein the processor is configured to determine the voltage across the first wire based on a value obtained by subtracting a sum of the voltages of the plurality of battery modules and a sum of voltages of the plurality of bus-bars from the voltage of the battery pack.

10. A method of diagnosing a connection status of a battery pack including a plurality of battery modules, the method comprising:
  measuring a current of the battery pack;
  measuring a voltage of the battery pack;
  measuring a voltage of each of the plurality of battery modules;
  measuring a voltage of a bus-bar connecting first and second battery modules of the plurality of battery modules to one another; and
  diagnosing a connection status of the bus-bar;
  determining a voltage across a first wire connected to the battery pack based on the voltage of the bus-bar, the voltage of the battery pack, and the voltages of the plurality of battery modules;
  calculating a resistance of the first wire based on the voltage across the first wire and the current of the battery pack; and
  diagnosing a connection status of the first wire based on the resistance of the first wire.

11. The method of claim 10, wherein the diagnosing the connection status comprises:
  further comprising calculating a resistance of the bus-bar based on the voltage of the bus-bar and the current of the battery pack; and,
  wherein diagnosing the connection status of the bus-bar is based on the resistance of the bus-bar.

12. The method of claim 10, wherein the first wire connects a positive terminal of the battery pack to a first switch for controlling current supply of the battery pack, and wherein a second wire connects a negative terminal of the battery pack to a second switch for controlling current supply of the battery pack, and
  wherein measuring the voltage of the battery pack is based on a voltage between a first node at which the first wire is connected to the first switch and a second node at which the second wire is connected to the second switch.

13. A battery management system comprising:
  a voltage measuring circuit configured to measure a voltage of a bus-bar connecting two battery modules of a battery pack to one another, a voltage of the battery pack, and voltages of a plurality of battery modules included in the battery pack, the plurality of battery modules including the two battery modules; and
  a processor configured to diagnose a connection status of the bus-bar and a connection status of a wire connecting the battery pack to a switch for controlling current supply of the battery pack,
  wherein the processor is configured to:
  diagnose the connection status of the bus-bar;
  determine a voltage across the wire based on the voltage of the bus-bar, the voltage of the battery pack, and the voltages of the plurality of battery modules;
  calculate a resistance of the wire based on the voltage across the wire and a current of the battery pack; and
  diagnose the connection status of the wire based on the resistance of the wire.

* * * * *